(12) United States Patent
Nakamura

(10) Patent No.: US 11,437,506 B2
(45) Date of Patent: Sep. 6, 2022

(54) WIDE-GAP SEMICONDUCTOR DEVICE

(71) Applicant: SHINDENGEN ELECTRIC MANUFACTURING CO., LTD., Tokyo (JP)

(72) Inventor: Shunichi Nakamura, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 161 days.

(21) Appl. No.: 16/763,550

(22) PCT Filed: Nov. 13, 2017

(86) PCT No.: PCT/JP2017/040677
§ 371 (c)(1),
(2) Date: May 12, 2020

(87) PCT Pub. No.: WO2019/092872
PCT Pub. Date: May 16, 2019

(65) Prior Publication Data
US 2021/0376142 A1    Dec. 2, 2021

(51) Int. Cl.
*H01L 29/78*    (2006.01)
*H01L 29/08*    (2006.01)

(52) U.S. Cl.
CPC ........ *H01L 29/7808* (2013.01); *H01L 29/086* (2013.01)

(58) Field of Classification Search
CPC combination set(s) only.
See application file for complete search history.

(56) References Cited

U.S. PATENT DOCUMENTS

| 5,426,320 | A |   | 6/1995 | Kikai |
| 5,767,550 | A |   | 6/1998 | Calafut et al. |
| 2001/0032999 | A1 |   | 10/2001 | Yoshida |
| 2006/0261391 | A1 | * | 11/2006 | Nakazawa ........ H01L 29/66734 257/E29.136 |
| 2010/0176443 | A1 |   | 7/2010 | Takaishi |
| 2012/0153300 | A1 |   | 6/2012 | Lidow et al. |

(Continued)

FOREIGN PATENT DOCUMENTS

| JP | S63037846 A | 2/1988 |
| JP | H03129779 A | 6/1991 |

(Continued)

OTHER PUBLICATIONS

International Search Report in the international application No. PCT/JP2017/040677, dated Jan. 30, 2018, and its english translation provided by WIPO.

(Continued)

*Primary Examiner* — Moin M Rahman
*Assistant Examiner* — Mohammad A Rahman
(74) *Attorney, Agent, or Firm* — Ladas & Parry, LLP

(57) ABSTRACT

A wide gap semiconductor device has: a drift layer using wide gap semiconductor material being a first conductivity type; a well region being a second conductivity type and provided in the drift layer; a source region provided in the well region; a gate contact region provided in the well region and electrically connected to a gate pad; and a Zener diode region provided in the well region and provided between the source region and the gate contact region.

7 Claims, 11 Drawing Sheets

(56) References Cited

U.S. PATENT DOCUMENTS

| | | | |
|---|---|---|---|
| 2012/0326207 A1 * | 12/2012 | Yoshimochi | H01L 29/0653 257/E29.198 |
| 2013/0175549 A1 | 7/2013 | Okumura et al. | |
| 2015/0008450 A1 | 1/2015 | Suekawa et al. | |

FOREIGN PATENT DOCUMENTS

| | | | | |
|---|---|---|---|---|
| JP | H07015006 A | | 1/1995 | |
| JP | H08288526 A | | 11/1996 | |
| JP | 2006179631 A | | 7/2006 | |
| JP | 2009004399 A | | 1/2009 | |
| JP | 2010263032 A | | 11/2010 | |
| JP | 2012064727 A | | 3/2012 | |
| JP | 2014504013 A | | 2/2014 | |
| JP | 2015159235 | * | 2/2014 | |
| JP | 2015015329 A | | 1/2015 | |
| JP | 2015159235 | * | 9/2015 | H01L 27/04 |
| JP | 2015159235 A | | 9/2015 | |

OTHER PUBLICATIONS

Written Opinion of the International Searching Authority in the international application No. PCT/JP2017/040677, dated Jan. 30, 2018 and English translation provided by Google Translate.

International Preliminary Report on Patentability of the international Searching Authority in the international application No. PCT/JP2017/040677, dated Oct. 19, 2018 and English translation provided by Google Translate.

Supplementary European Search Report from EP app. No. 17931382.0, dated May 28, 2021.

Notice of Reasons for Refusal from JP app. No. 2019-551851, dated Jun. 15, 2021, with English translation from Global Dossier.

* cited by examiner

WIDE-GAP SEMICONDUCTOR DEVICE

TECHNICAL FIELD

The present invention relates to a wide gap semiconductor device having a drift layer being a first conductivity type, a well region being a second conductivity type provided in the drift layer, and a source region provided in the well region.

BACKGROUND ART

In a power MOSFET, it is proposed to provide a Zener diode between a gate and a source in order to protect a gate insulating film. For example, JP 2012-064727 A proposes that such a Zener diode is manufactured by multiple connection of p-type polysilicon and n-type polysilicon doped at a high concentration.

A MOSFET including a wide gap semiconductor such as SiC can be used at high temperatures. However, a Zener diode including polysilicon as disclosed in JP 2012-064727 A increases leakage currents at high temperatures. The increase of leakage currents reduces a charge/discharge rate of a gate, which causes a slowdown of switching. MOSFETs including a wide gap semiconductor such as SiC generally require a higher driving voltage than Si-MOSFETs and have a large Ciss (input capacitance). Accordingly, in MOSFETs with a wide gap semiconductor, a charge/discharge rate is easily affected by leakage currents.

SUMMARY OF INVENTION

Problem to be Solved by Invention

The present invention provides a wide gap semiconductor device which can prevent reduction of a charge/discharge rate and protect of a gate insulating film.

Means to Solve the Problem

Concept 1

A wide gap semiconductor device may comprise:
a drift layer being a first conductivity type;
a well region being a second conductivity type and provided in the drift layer;
a source region provided in the well region;
a gate contact region provided in the well region and electrically connected to a gate pad; and
a Zener diode region provided in the well region and provided between the source region and the gate contact region in a plane direction.

Concept 2

In the wide gap semiconductor device according to concept 1,
the Zener diode region may have a superhigh-concentration second conductivity type semiconductor region and a high-concentration first conductivity type semiconductor region adjacent to the superhigh-concentration second conductivity type semiconductor region,
the gate contact region may be adjacent to the high-concentration first conductivity type semiconductor region, and the superhigh-concentration second conductivity type semiconductor region may be provided in a side of the source region than the high-concentration first conductivity type semiconductor region.

Concept 3

In the wide gap semiconductor device according to concept 1 or 2,
the gate contact region may be a superhigh-concentration first conductivity type semiconductor region or a high-concentration first conductivity type semiconductor region.

Concept 4

In the wide gap semiconductor device according to any one of concepts 1 to 3,
the Zener diode region and the source region may be separated in the plane direction.

Concept 5

A wide gap semiconductor device may comprise:
a drift layer being a first conductivity type;
a well region being a second conductivity type and provided in the drift layer;
a source region provided in the well region; and
a secondary MOSFET region provided in the well region, wherein
the secondary MOSFET region has a pair of first conductivity type semiconductor regions, a second conductivity type semiconductor region provided between the pair of the first conductivity type semiconductor regions, and a secondary MOSFET gate electrode, which is provided on the first conductivity type semiconductor regions and the second conductivity type semiconductor region via a secondary MOSFET insulating layer and which is electrically connected to a gate pad,
one of the first conductivity type semiconductor regions is electrically connected to a source pad, and
the other of the first conductivity type semiconductor regions is electrically connected to a gate pad.

Concept 6

In the wide gap semiconductor device according to concept 5,
the first conductivity type semiconductor region may have a high-concentration first conductivity type region, and
the second conductivity type semiconductor region may have a high-concentration second conductivity type region.

Concept 7

In the wide gap semiconductor device according to any one of concepts 1 to 6,
the well region may have a first well region provided below a part of the gate pad and a second well region separated from the first well region,
the Zener diode region or the secondary MOSFET region may be provided in the first well region.

Concept 8

In the wide gap semiconductor device according to any one of concepts 1 to 7, a separation region, being a first conductivity type semiconductor and having a higher impurity concentration than the drift layer, may be provided between the first well region and the second well region.

Concept 9

In the wide gap semiconductor device, according to any one of concepts 1 to 8, may further comprise:

an interlayer insulating film; and a gate insulating film provided between the well region and the interlayer insulating film, wherein the gate insulating film has a substantially uniform thickness.

Effects of Invention

In the present invention, the Zener diode region or the secondary MOSFET region is provided between the source region and the gate contact region. Thus, it is possible to prevent reduction of a charge/discharge rate and protect a gate insulating film.

DESCRIPTION OF EMBODIMENTS

First Embodiment

Configuration

In this embodiment, a vertical MOSFET will be described as an example. In this embodiment, a first conductivity type is described as n-type, and a second conductivity type is described as p-type. However, the present invention is not limited to such an aspect. The first conductivity type may be p-type, and the second conductivity type may be n-type. Furthermore, silicon carbide is employed as a wide gap semiconductor in this embodiment, but the present invention is not limited to such an aspect. Gallium nitride or the like may be employed as the wide gap semiconductor. In this embodiment, a direction perpendicular to a thickness direction or the vertical direction in FIG. 1 is referred to as "in-plane direction." In other words, a plane including the horizontal direction and the normal direction of FIG. 1 is the "in-plane direction."

Figure 3:
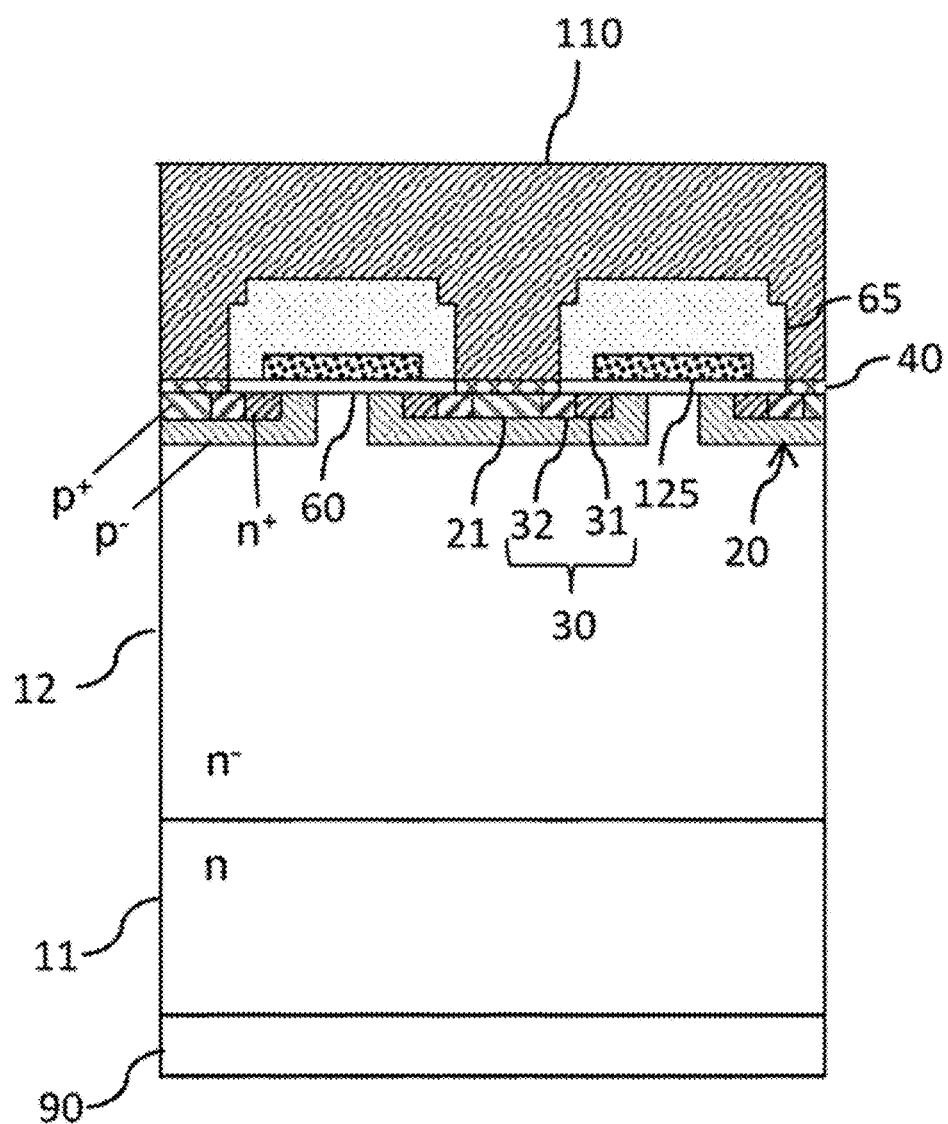
FIG. 3 is a cross-sectional view of the semiconductor device used in the first embodiment of the present invention, and the view illustrates the side close to a cell region.

As illustrated in FIG. 3, a silicon carbide semiconductor device according to this embodiment may have an n-type silicon carbide semiconductor substrate 11, a drift layer 12 provided on a first main surface (upper surface) of the silicon carbide semiconductor substrate 11 and including an n-type silicon carbide material, a plurality of p-type well regions 20 provided in the drift layer 12, and an n-type source region 30 provided in each well region 20. The well region 20 may be formed by, for example, implantation of a p-type impurity into the drift layer 12. The source region 30 may be formed by, for example, implantation of an n-type impurity into the well region 20. A drain electrode 90 may be provided on a second main surface (lower surface) of the silicon carbide semiconductor substrate 11. A withstand voltage structure may be provided outside a circumferential part of a region used as a cell. The drain electrode 90 may include, for example, titanium, aluminum, or nickel.

Figure 1:
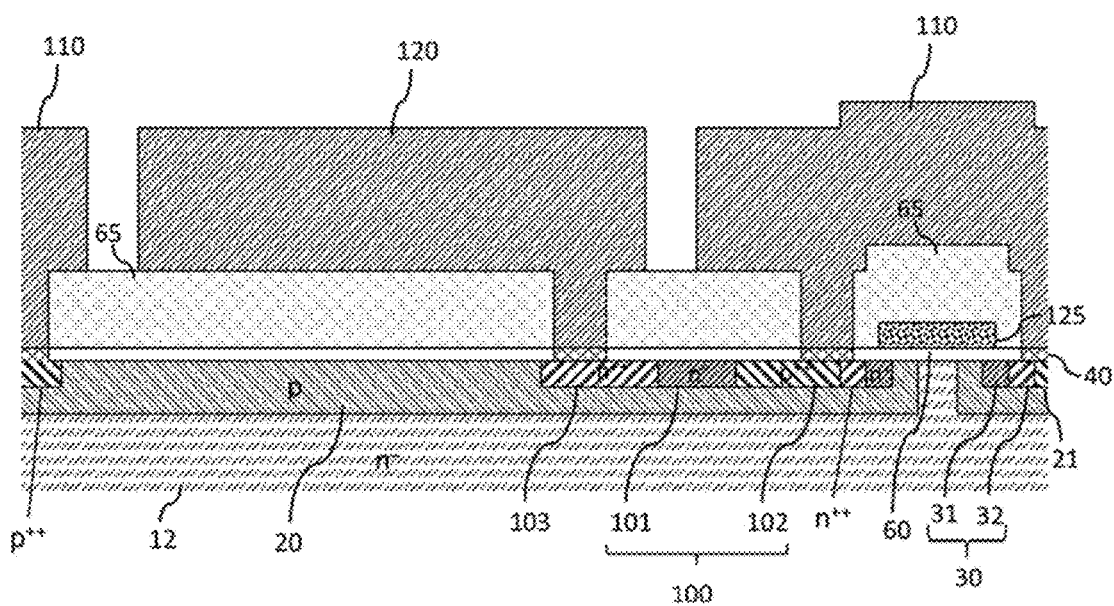
FIG. 1 is a cross-sectional view of a semiconductor device used in a first embodiment of the present invention.

As illustrated in FIG. 1, the silicon carbide semiconductor device may have a gate contact region 103 provided in the well region 20 and electrically connected to a gate pad 120, and a Zener diode region 100 provided in the well region 20 and between the source region 30 and the gate contact region 103. The gate contact region 103 and the Zener diode region 100 may be formed by, for example, implantation of an n-type impurity or a p-type impurity into the well region 20.

The gate contact region 103 may be a superhigh-concentration n-type semiconductor region ($n^{++}$) or a high-concentration p-type semiconductor region ($n^+$). The gate contact region 103 may be formed by contact between the gate pad 120 and the superhigh-concentration n-type semiconductor region ($n^{++}$) or the high-concentration p-type semiconductor region ($n^+$) through a gate contact hole provided in an interlayer insulating film 65. In an aspect illustrated in FIG. 1, the gate contact region 103 is a superhigh-concentration n-type semiconductor region ($n^{++}$), and the superhigh-concentration n-type semiconductor region ($n^{++}$) is electrically connected to the gate pad 120.

Figure 2:
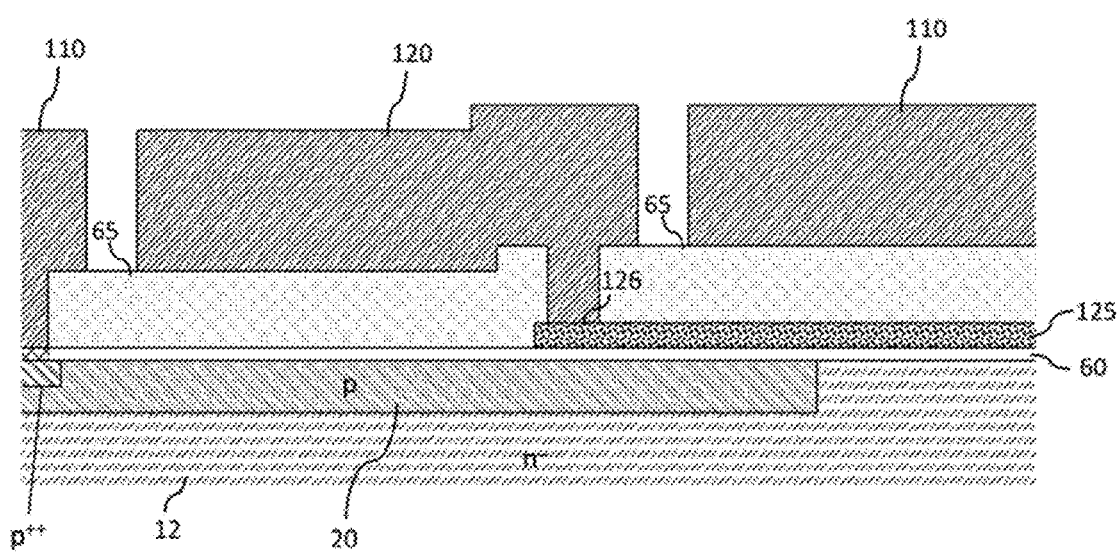
FIG. 2 is a cross-sectional view of the semiconductor device used in the first embodiment of the present invention, and the view illustrates a part different from one illustrated in FIG. 1.

As illustrated in FIG. 2, at a part other than the gate contact region 103, the gate pad 120 may be connected to a gate electrode 125 so as to form a gate connection region 126. The gate connection region 126 may be formed by contact between the gate electrode 125 and the gate pad 120 via a gate contact hole provided in the interlayer insulating film 65.

A gate insulating film 60 is provided between the well region 20 and the interlayer insulating film 65. The gate insulating film 60 may have a substantially uniform thickness. In other words, in this embodiment, a field insulating film which is typically provided below the gate pad 120 may not be employed. The "substantially uniform thickness" indicates that the thickness is within 10% of an average thickness $D_0$ of the gate insulating film 60 and that the thickness of the gate insulating film 60 between the well region 20 and the interlayer insulating film 65 is $0.9 \times D_0$ or more and $1.1 \times D_0$ or less.

As illustrated in FIG. 1, the gate electrode 125 may be provided on the gate insulating film 60 between the source regions 30. As illustrated in FIG. 2, the gate electrode 125 is electrically connected to the gate pad 120.

The drift layer 12 may be formed on the first main surface of the silicon carbide semiconductor substrate 11 by CVD or the like. The drift layer 12 may have a lower n-type imparity concentration than that of the silicon carbide semiconductor substrate 11. The drift layer 12 may have a low-concentration region (n⁻), and the silicon carbide semiconductor substrate 11 may have a higher concentration than that of the drift layer 12.

N and P, for example, are employable as the n-type impurity, and Al and B, for example, are employable as the p-type impurity. The low-concentration region (n⁻), or the drift layer 12 in this embodiment, has an impurity concentration of, for example, $1 \times 10^{14}$ to $4 \times 10^{16}$ cm$^{-3}$. The silicon carbide semiconductor substrate 11 has an impurity concentration of, for example, $1 \times 10^{18}$ to $3 \times 10^{18}$ cm$^{-3}$.

The gate pad 120 may include a metal such as Al, and the gate electrode 125 may be formed of, for example, polysilicon. The interlayer insulating film 65 may be formed on the upper surface of the gate electrode 125 and the like. The gate electrode 125 may be formed by, for example, CVD or photolithography. The interlayer insulating film 65 may be formed by CVD or the like and may include, for example, silicon dioxide.

As illustrated in FIG. 1, the Zener diode region 100 may have the aforementioned superhigh-concentration p-type semiconductor region (p⁺⁺) 102 and high-concentration n-type semiconductor region (n⁺) 101 adjacent to the superhigh-concentration p-type semiconductor region 102. The gate contact region 103 may be adjacent to the high-concentration n-type semiconductor region 101. A high-concentration n-type region (n⁺) in this embodiment has an impurity concentration of, for example, $1 \times 10^{18}$ to $2 \times 10^{19}$ cm$^{-3}$, and a superhigh-concentration n-type region (n⁺⁺) has an impurity concentration of, for example, $2 \times 10^{19}$ to $1 \times 10^{21}$ cm$^{-3}$. The well region 20 in this embodiment has an impurity concentration of, for example, $5 \times 10^{16}$ to $1 \times 10^{19}$ cm$^{-3}$. A superhigh-concentration p-type region (p⁺⁺) has an impurity concentration of, for example, $2 \times 10^{19}$ to $1 \times 10^{21}$ cm$^{-3}$, and a high-concentration p-type region (p⁺) has an impurity concentration of, for example, $3 \times 10^{17}$ to $2 \times 10^{19}$ cm$^{-3}$.

Each of the superhigh-concentration p-type semiconductor region 102, the high-concentration n-type semiconductor region 101, and the gate contact region 103 may have substantially equal depths. In this embodiment, the "substantially equal depths" indicates that each depth is within 10% of an average depth. Accordingly, the superhigh-concentration p-type semiconductor region 102, the high-concentration n-type semiconductor region 101, and the gate contact region 103 being substantially equal in depth indicates that these are within 10% of an average depth $H_0$ of the superhigh-concentration p-type semiconductor region 102, the high-concentration n-type semiconductor region 101 and the gate contact region 103, and each of the superhigh-concentration p-type semiconductor region 102, the high-concentration n-type semiconductor region 101 and the gate contact region 103 has a depth of $0.9 \times H_0$ or more and $1.1 \times H_0$ or less.

Furthermore, the superhigh-concentration p-type semiconductor region 102, the high-concentration n-type semiconductor region 101, and the gate contact region 103 each may have a depth substantially equal to those of a high-concentration n-type region 31 and a superhigh-concentration n-type region 32 of the source region 30.

A depth of the well region 20 is set so that a bottom surface of the well region 20 is higher than a bottom surface of the drift layer 12, which indicates that the well region 20 is provided in the drift layer 12. In addition, a depth of the source region 30 is set so that a bottom surface of the source region 30 is higher than the bottom surface of the well region 20, which indicates that the source region 30 is formed in the well region 20. Depths of the gate contact region 103 and the Zener diode region 100 are set so that bottom surfaces of those regions are higher than the bottom surface of the well region 20, which indicates that the gate contact region 103 and the Zener diode region 100 are formed in the well region 20.

In the source region 30, a part connected to the source pad 110 may be a superhigh-concentration n-type region (n⁺⁺), and a high-concentration n-type region (n⁺) may be adjacent to the superhigh-concentration n-type region (n⁺⁺).

The Zener diode region 100 as in this embodiment may be provided not only around the gate pad 120 but also around a gate runner (not illustrated) or a wire relative to the gate electrode provided on the interlayer insulating film 65 along whole or part of a circumferential part of a cell region. The present invention is not limited to such an aspect, and the Zener diode region 100 as in this embodiment may be provided only around the gate pad 120 or may be provided only around the gate runner.

As illustrated in FIG. 1, the source region 30 may have the high-concentration n-type region (n⁺) 31 provided on the side closer to the gate electrode 125 and the superhigh-concentration n-type region (n⁺⁺) 32 adjacent to the high-concentration n-type region (n⁺) 31. In addition, the superhigh-concentration p-type semiconductor region 102 of the Zener diode region 100 may be adjacent to the superhigh-concentration n-type region (n⁺⁺) 32. Between the source pad 110 and the superhigh-concentration n-type region (n⁺⁺) 32 of the source region 30 and between the source pad 110 and the superhigh-concentration p-type semiconductor region 102 of the Zener diode region 100, a metallic layer 40 including nickel, titanium, or an alloy containing nickel or titanium may be provided.

The superhigh-concentration n-type region (n⁺⁺) 32 of the source region 30 may come into contact with the metallic layer 40 provided below the source pad 110 by an ohmic contact. Furthermore, the superhigh-concentration p-type semiconductor region 102 may come into contact with the metallic layer 40 provided below the source pad 110 by an ohmic contact.

As illustrated in FIG. 3, a well contact region 21 that is in contact with the metallic layer 40 may be provided between the source regions 30 in the plane direction. The well contact region 21 may include a superhigh-concentration p-type semiconductor. The well contact region 21 and the metallic layer 40 may be in contact with each other by an ohmic contact. The well contact region 21 may be formed by, for example, implantation of a p-type impurity into the well region 20.

Operations and Effects

Next, examples of operation and effect of the present embodiment having the above-described configuration will be described. Note that all aspects described in "Operation and Effects" can be adopted in the above-described configuration.

In this embodiment, as illustrated in FIG. 1, in an aspect where the Zener diode region 100 is provided between the source region 30 and the gate contact region 103, it is possible to prevent reduction in charge/discharge rate and to protect the gate insulating film 60.

In a case where the Zener diode region 100 has the superhigh-concentration p-type semiconductor region ($p^{++}$) 102 and the high-concentration n-type semiconductor region ($n^{+}$) 101 adjacent to the superhigh-concentration p-type semiconductor region ($p^{++}$) 102 and where the high-concentration n-type semiconductor region 101 has a higher n-type impurity concentration than a p-type impurity concentration in the well region 20, a withstand voltage is determined by a junction between the superhigh-concentration p-type semiconductor region 102 and the high-concentration n-type semiconductor region 101. In a wide gap semiconductor such as silicon carbide, even when such a high-concentration region has only one junction, it is possible to apply a sufficient positive bias to a gate and to provide a withstand voltage (for example, 15 to 40 V) preferable for protecting the gate from an excessive positive bias. For example, with 4H—SiC, when the high-concentration n-type semiconductor region ($n^{+}$) 101 has an impurity concentration of $2.5 \times 10^{18}$ cm$^{-3}$ and the superhigh-concentration p-type semiconductor region ($p^{++}$) 102 has a sufficiently higher impurity concentration (for example, at $2 \times 10^{20}$ cm$^{-3}$), a withstand voltage obtained by device simulation is about 30 V.

Furthermore, in a case where the Zener diode region 100 is provided as in this embodiment, a thickness of the well region 20 is increased to such an extent that a parasitic bipolar transistor does not operate, which makes it possible to transfer part of junction capacitance between the drift layer 12 and the well region 20 to Crss (reverse transfer capacitance). Accordingly, it is possible to perform passive mirror operation and to prevent dV/dt from increasing more than necessary.

In this embodiment, as illustrated in FIG. 2, in an aspect where the gate insulating film 60 between the well region 20 and the interlayer insulating film 65 has a substantially uniform thickness and where no field insulating film is provided, it is possible to prevent a decrease of a gate withstand voltage. In other words, in a case where a field insulating film is provided and the gate insulating film 60 is provided on the field insulating film, a step is formed in the gate insulating film 60. Such a step decreases a gate withstand voltage. On the other hand, in an aspect where the gate insulating film 60 has a substantially uniform thickness and where no field insulating film is provided, such a step is not formed in the first place, which makes it possible to prevent a decrease of a gate withstand voltage.

Second Embodiment

Hereinafter, a second embodiment of the present invention will be described.

Figure 4:
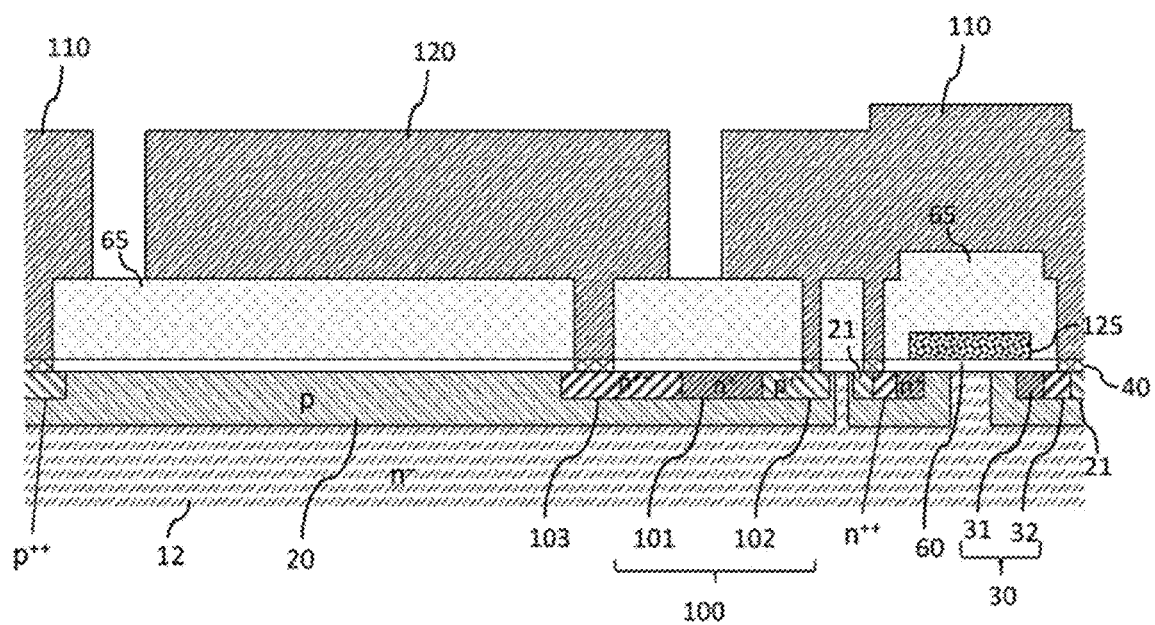
FIG. 4 is a cross-sectional view of a semiconductor device used in a second embodiment of the present invention.

In this embodiment, as illustrated in FIG. 4, a well region 20 provided with a Zener diode region 100 and a well region 20 provided with a source region 30 are separated in the plane direction. Other configurations are similar to those of the first embodiment. The second embodiment can employ any configuration employed in the first embodiment. The members described in the first embodiment are described with the same reference numerals.

As described in the first embodiment, in a case where the Zener diode region 100 is provided as in this embodiment, an increase in thickness of the well region 20 makes it possible to transfer part of junction capacitance between the Zener diode region 100 and the well region 20 to Crss (reverse transfer capacitance) and to perform passive mirror operation. Performing such passive mirror operation is advantageous in that the well region 20 provided with a superhigh-concentration p-type semiconductor region 102 of the Zener diode region 100 and the source region 30 is separated. In this case, as illustrated in FIG. 4, the superhigh-concentration p-type semiconductor region 102 of the Zener diode region 100 and the well region 20 provided with a well contact region 21 adjacent to the source region 30 may be separated in the plane direction.

Third Embodiment

Hereinafter, a third embodiment of the present invention will be described.

Figure 5:
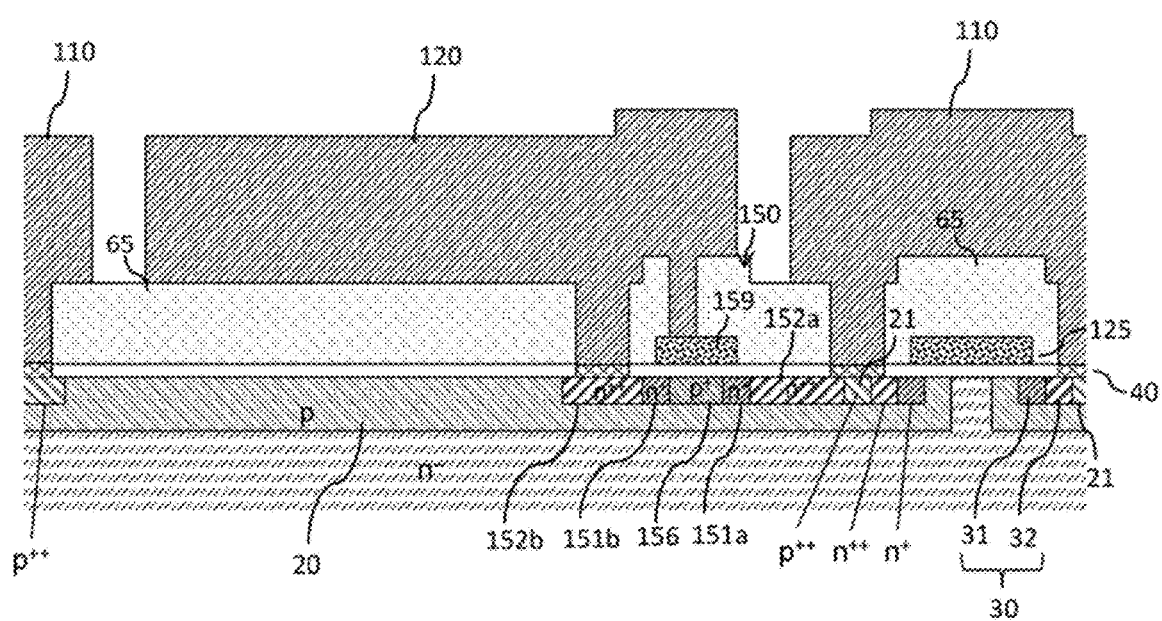
FIG. 5 is a cross-sectional view of a semiconductor device used in a third embodiment of the present invention.

In this embodiment, as illustrated in FIG. 5, a planar secondary MOSFET region 150 is provided in a well region 20. The secondary MOSFET region 150 has a pair of n-type semiconductor regions 151a, 151b, 152a, and 152b, a p-type semiconductor region 156 provided between the pair of n-type semiconductor regions 151a, 151b, 152a, and 152b, and a secondary MOSFET gate electrode 159. The secondary MOSFET gate electrode 159 is provided on the n-type semiconductor regions 151a, 151b, 152a, 152b and the p-type semiconductor region 156 via a gate insulating film 60 serving as a secondary MOSFET insulating layer and is electrically connected to a gate pad 120. The third embodiment can employ any configuration employed in each of the above embodiments. The members described in the above embodiments are described with the same reference numerals. In an aspect illustrated in FIG. 5, one of the pair of n-type semiconductor regions 151a, 151b, 152a, and 152b has n-type semiconductor regions 151a and 152a electrically connected to the source pad 110, and the other has n-type semiconductor regions 151b and 152b electrically connected to the gate pad 120.

The n-type semiconductor regions 151a, 151b, 152a, and 152b of the secondary MOSFET region 150 may have high-concentration n-type regions ($n^{+}$) 151a and 151b and superhigh-concentration n-type regions ($n^{++}$) 152a and 152b having a higher impurity concentration than that of the high-concentration n-type regions 151a and 151b. One superhigh-concentration n-type region 152a may come into contact with the source pad 110 via a metallic layer 40 to form a source contact region, and the other superhigh-concentration n-type region 152b may come into contact with the gate pad 120 to form a gate contact region. The p-type semiconductor region 156 of the secondary MOSFET region 150 may be a high-concentration p-type semiconductor region ($p^{+}$). A threshold voltage of the secondary MOSFET is required to be higher than a positive bias to be applied to a gate of a cell. Accordingly, in a case where at least the gate insulating film 60 of the secondary MOSFET is substantially equal to the cell in thickness, the p-type semiconductor region 156 is required to have a higher impurity concentration than that of the well region 20.

Figure 6:
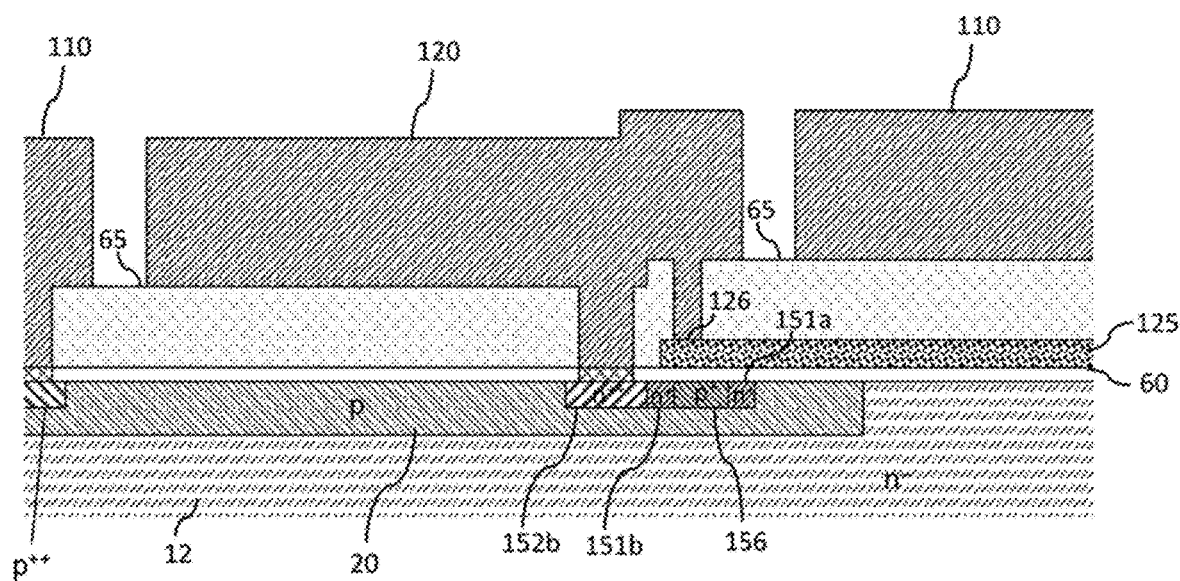
FIG. 6 is a cross-sectional view of the semiconductor device used in the third embodiment of the present invention, and the view illustrates a part different from one illustrated in FIG. 5.
Figure 7:
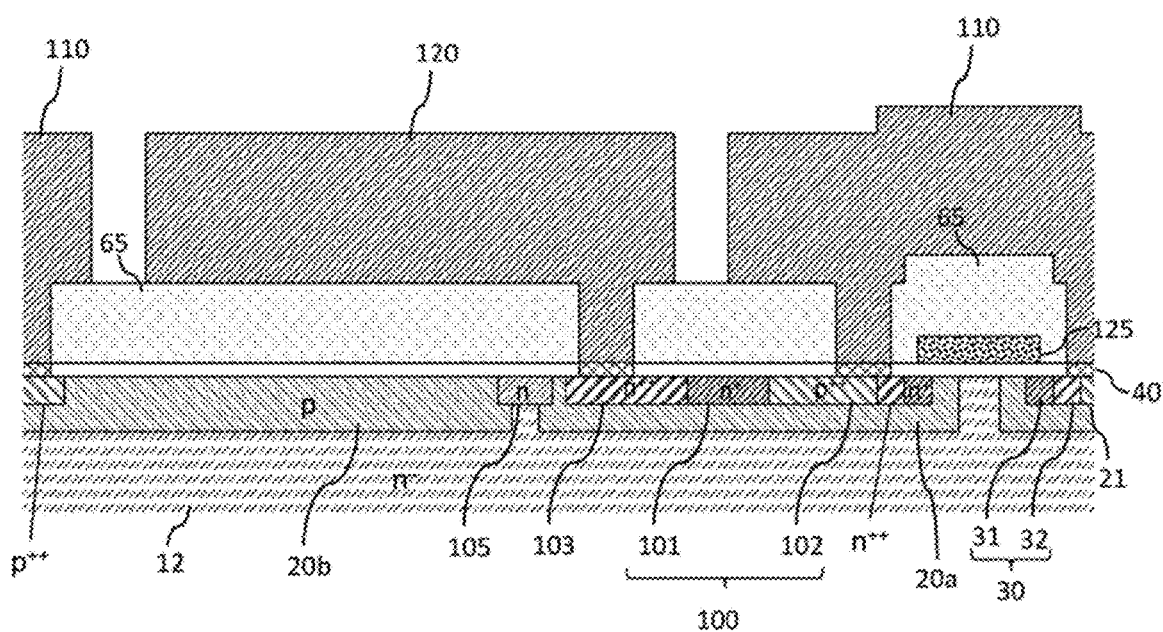
FIG. 7 is a cross-sectional view of a semiconductor device according to a fourth embodiment of the present invention based on an aspect according to the first embodiment.
Figure 8:
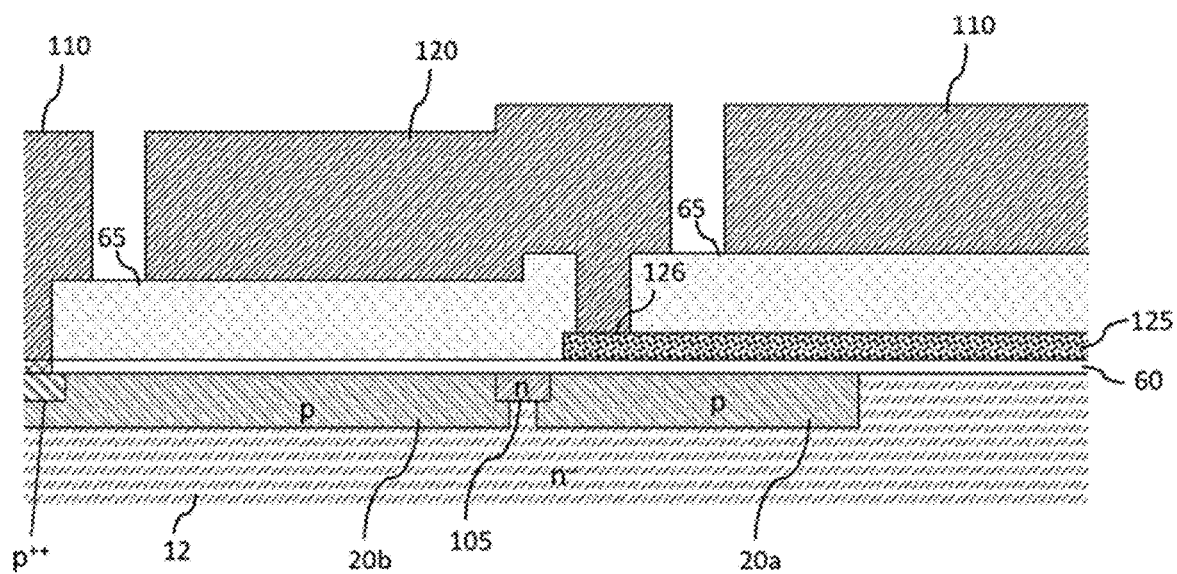
FIG. 8 is a cross-sectional view of the semiconductor device according to the fourth embodiment based on an aspect according to first embodiment, and the view illustrates a part different from one illustrated in FIG. 7.
Figure 9:
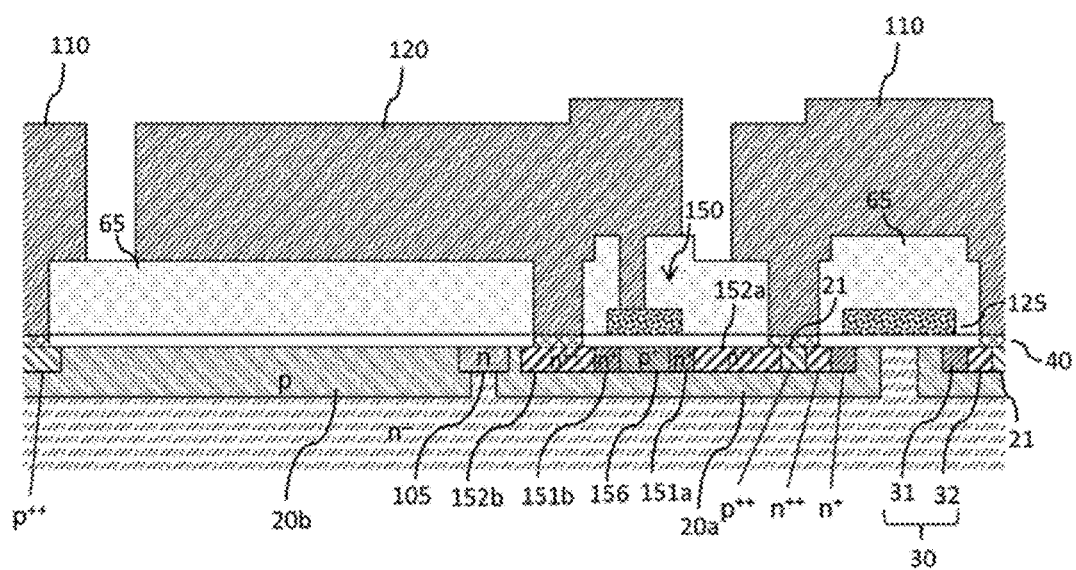
FIG. 9 is a cross-sectional view of a semiconductor device according to a fourth embodiment of the present invention based on an aspect according to the third embodiment.
Figure 10:
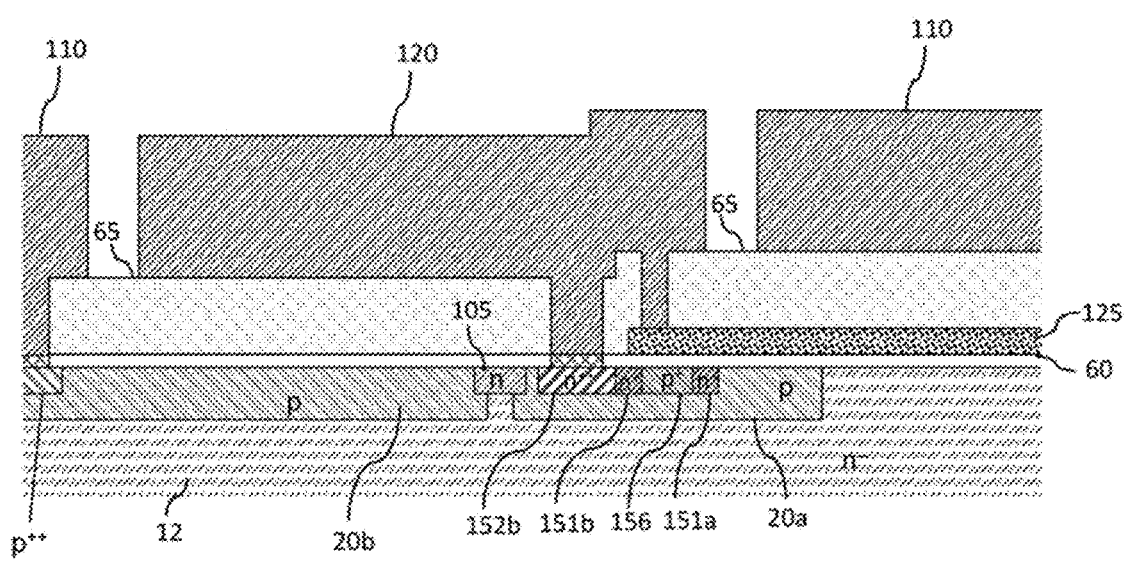
FIG. 10 is a cross-sectional view of the semiconductor device according to the fourth embodiment of the present invention based on an aspect according to the third embodiment, and the view illustrates a part different from one illustrated in FIG. 9.

As illustrated in FIG. 6, a gate electrode 125 and the gate pad 120 are electrically connected via a gate connection region 126. This gate electrode 125 may be electrically connected to the secondary MOSFET gate electrode 159 illustrated in FIG. 5. Furthermore, the gate electrode 125 and the secondary MOSFET gate electrode 159 may be formed in an integrated manner.

In regard to depths of the n-type semiconductor regions 151a, 151b, 152a, 152b and the p-type semiconductor region 156 of the secondary MOSFET region 150, bottom surfaces thereof are placed higher than a bottom surface of the well region 20. Thus, the n-type semiconductor regions 151a, 151b, 152a, 152b and the p-type semiconductor region 156 of the secondary MOSFET region 150 are formed in the well region 20. Each of the n-type semiconductor regions 151a, 151b, 152a, 152b and the p-type semiconductor region 156 of the secondary MOSFET region 150 may be formed by, for example, implantation of an n-type impurity or a p-type impurity into the well region 20.

The n-type semiconductor regions 151a, 151b, 152a, 152b and the p-type semiconductor region 156 may have a substantially equal depth. Furthermore, the n-type semiconductor regions 151a, 151b, 152a and 152b and the p-type semiconductor region 156; and the high-concentration n-type region 31 and the superhigh-concentration n-type region 32 of the source region 30 may have a substantially equal depth.

The secondary MOSFET region 150 as in this embodiment may be provided not only around the gate pad 120 but also around a gate runner. The present invention is not limited to such an aspect, and the secondary MOSFET region 150 as in this embodiment may be provided only around the gate pad 120 or may be provided only around the gate runner.

Furthermore, both the Zener diode region 100 as described in each of the embodiments and the secondary MOSFET region 150 in this embodiment may be employed, and the Zener diode region 100 and the secondary MOSFET region 150 are may be provided around the gate pad 120 and around the gate runner. Still further, both the Zener diode region 100 and the secondary MOSFET region 150 may be provided only around the gate pad 120 or may be provided only around the gate runner. Alternatively, one of the Zener diode region 100 and the secondary MOSFET region 150 may be provided only around the gate pad 120, and the other may be provided only around the gate runner.

Fourth Embodiment

Hereinafter, a fourth embodiment of the present invention will be described.

In this embodiment, as illustrated in FIGS. 7 to 10, a well region 20 has a first well region 20a provided below a part of a gate pad 120 and a second well region 20b separated from the first well region 20a in the plane direction. The fourth embodiment can employ any configuration employed in each of the above embodiments. The members described in the above embodiments are described with the same reference numerals. In an aspect illustrated in FIG. 7, a Zener diode region 100 is provided in the first well region 20a. In an aspect illustrated in FIG. 9, a part of a secondary MOSFET region 150 is provided in the first well region 20a.

In a case where a potential of the well region 20 rises due to a displacement current that charges large junction capacitance between a drift layer 12 below the gate pad 120 and the well region 20 during switching, a large current sometimes flows through a gate electrode 125. In this case, dV/dt is significantly limited. For this reason, as in this embodiment, it is favorable to separate the first well region 20a and the second well region 20b, to cover a large part of the region below the gate pad 120 (for example, 80% or more in the region in the plane direction) with the second well region 20b, and to separate the second well region 20b from a cell region and from the first well region 20a provided with the Zener diode region 100 or the secondary MOSFET region 150. In this manner, the first well region 20a and the second well region 20b are separated so as to prevent significant limitation of dV/dt.

As illustrated in FIGS. 7 to 10, a separation region 105 being an n-type semiconductor having a higher impurity concentration than a drift layer 12 may be provided between the first well region 20a and the second well region 20b. Due to the separation region 105 that includes the n-type semiconductor having a higher impurity concentration than that of the drift layer 12, it is possible to separate the first well region 20a and the second well region 20b more reliably. The separation region 105 may be formed by, for example, implantation of an n-type impurity around a gap of the well region 20. The separation region 105 has an impurity concentration of, for example, $5 \times 10^{16}$ to $5 \times 10^{17}$ cm$^{-3}$.

Fifth Embodiment

Hereinafter, a fifth embodiment of the present invention will be described.

In this embodiment, in a case where the Zener diode region 100 according to the first embodiment, the second embodiment or the fourth embodiment is employed, a high-concentration n-type region (n$^+$) 103a is employed as a gate contact region, and the gate contact region 103a is brought into contact with the gate pad 120 by a Schottky contact, instead of employing a superhigh-concentration n-type region (n$^{++}$) as a gate contact region and bringing the gate contact, region into contact with the gate pad 120 by an ohmic contact. Furthermore, a part of the gate contact region 103a excluding an end has an n-type impurity concentration lower than a p-type impurity concentration of the well region 20, and the part may be, for example, a low-concentration n-type region (n$^-$) 109. The fifth embodiment can employ any configuration employed in each of the above embodiments. The members described in the above embodiments are described with the same reference numerals.

Employing a high-concentration n-type region (n$^+$) as the gate contact region 103a and bringing the gate contact region 103a into contact with the gate pad 120 by a Schottky contact enable application of a negative bias (for example, −3 V or lower) equal to or more than the built-in voltage of a pn diode.

Figure 11:
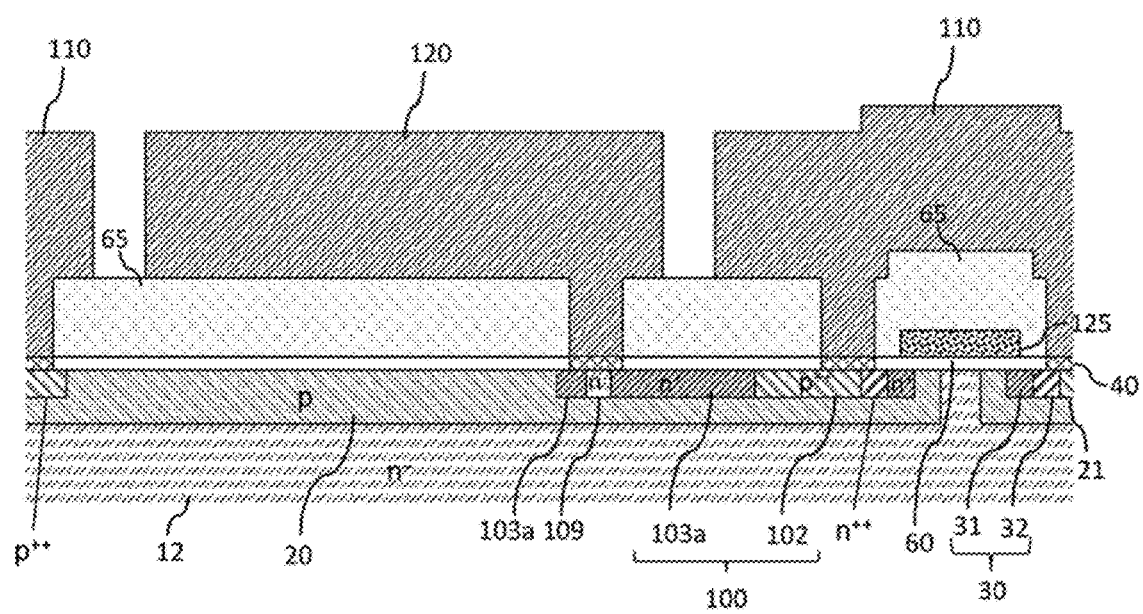
FIG. 11 is a cross-sectional view of a semiconductor device used in a fifth embodiment of the present invention.

Furthermore, as illustrated in FIG. 11, in an aspect where the gate contact region 103a is separated by the low-concentration n-type region 109, it is possible to deplete a part of the gate contact region 103a excluding an end and to prevent Ciss (input capacitance) from increasing excessively.

The description of each embodiment, the description of the modification, and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the description of the claims can be appropriately changed based on the description of the specification, the drawings, and the like.

EXPLANATION OF REFERENCE

12 Drift layer
20 Well region
20a First well region
20b Second well region
30 Source region
60 Gate insulating film
100 Zener diode region
101 High-concentration first conductivity type semiconductor region
102 Superhigh-concentration second conductivity type semiconductor region
103 Gate contact region
105 Separation region
120 Gate pad
125 Secondary MOSFET gate electrode
150 Secondary MOSFET region
151a, 151b, 152a, 152b n-type semiconductor region
156 p-type semiconductor region
159 Secondary MOSFET gate electrode

The invention claimed is:

1. A wide gap semiconductor device comprising:
a drift layer being a first conductivity type;
a well region being a second conductivity type and provided in the drift layer;
a source region provided in the well region;
a gate contact region provided in the well region under a gate pad and electrically connected to the gate pad; and
a Zener diode region provided in the well region and provided between the source region and the gate contact region in a plane direction, wherein
the Zener diode region has a superhigh-concentration second conductivity type semiconductor region provided below a source pad and an high-concentration first conductivity type semiconductor region adjacent to the superhigh-concentration second conductivity type semiconductor region and having a lower impurity concentration than the superhigh-concentration second conductivity type semiconductor region,
the gate contact region is adjacent to the high-concentration first conductivity type semiconductor region, and
the superhigh-concentration second conductivity type semiconductor region is provided on a source region side of the high-concentration first conductivity type semiconductor region.

2. The wide gap semiconductor device according to claim 1, wherein
the Zener diode region has a superhigh-concentration second conductivity type semiconductor region and a high-concentration first conductivity type semiconductor region adjacent to the superhigh-concentration second conductivity type semiconductor region,
the gate contact region is adjacent to the high-concentration first conductivity type semiconductor region, and
the superhigh-concentration second conductivity type semiconductor region is provided in a side of the source region than the high-concentration first conductivity type semiconductor region.

3. The wide gap semiconductor device according to claim 1, wherein
the gate contact region is a superhigh-concentration first conductivity type semiconductor region or a high-concentration first conductivity type semiconductor region.

4. The wide gap semiconductor device according to claim 1, wherein
the Zener diode region and the source region are separated in the plane direction.

5. The wide gap semiconductor device according to claim 1, wherein
the well region has a first well region provided below a part of the gate pad and a second well region separated from the first well region,
the Zener diode region or the secondary MOSFET region is provided in the first well region.

6. The wide gap semiconductor device, according to claim 1, further comprising:
an interlayer insulating film; and
a gate insulating film provided between the well region and the interlayer insulating film, wherein
the gate insulating film has a substantially uniform thickness.

7. A wide gap semiconductor device comprising:
a drift layer being a first conductivity type;
a well region being a second conductivity type and provided in the drift layer;
a source region provided in the well region;
a gate contact region provided in the well region and electrically connected to a gate pad; and
a Zener diode region provided in the well region and provided between the source region and the gate contact region in a plane direction, wherein
the well region has a first well region provided below a part of the gate pad and a second well region separated from the first well region,
the Zener diode region is provided in the first well region, and
a separation region, being a first conductivity type semiconductor and having a higher impurity concentration than the drift layer, is provided between the first well region and the second well region.

* * * * *